United States Patent
Siegel et al.

(10) Patent No.: US 7,898,323 B2
(45) Date of Patent: Mar. 1, 2011

(54) AMPLIFYING CIRCUIT WITH OFFSET COMPENSATION

(75) Inventors: Joshua Siegel, Austin, TX (US); Hector Sanchez, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 7 days.

(21) Appl. No.: 12/479,140

(22) Filed: Jun. 5, 2009

(65) Prior Publication Data
US 2010/0308912 A1 Dec. 9, 2010

(51) Int. Cl.
*H03F 1/02* (2006.01)
(52) U.S. Cl. .......................................... 330/9; 327/124
(58) Field of Classification Search ............... 330/9; 327/124, 307
See application file for complete search history.

(56) References Cited

U.S. PATENT DOCUMENTS

| | | | |
|---|---|---|---|
| 3,541,320 A * | 11/1970 | Beall ........................... 708/827 |
| 3,694,760 A * | 9/1972 | Loessi ............................ 330/9 |
| 4,429,282 A * | 1/1984 | Saari ............................... 330/9 |
| 4,553,052 A | 11/1985 | Takahashi |
| 5,032,744 A | 7/1991 | Liu |
| 5,410,270 A | 4/1995 | Rybicki et al. |
| 5,638,020 A * | 6/1997 | Koifman et al. ............. 327/382 |
| 6,097,248 A * | 8/2000 | Segami ........................... 330/9 |
| 7,250,813 B1* | 7/2007 | Yao ................................ 330/9 |
| 7,639,073 B2* | 12/2009 | Deng et al. .................... 330/9 |

* cited by examiner

*Primary Examiner* — Henry K Choe
(74) *Attorney, Agent, or Firm* — Joanna G. Chiu; James L. Clingan, Jr.

(57) ABSTRACT

An amplifying circuit has an offset calibration mode and a normal mode. The amplifying circuit includes an amplifier having a non-inverting input and an inverting input for receiving, during the normal mode, a first input signal and a second input signal and an output for providing a high speed output signal, wherein the first input signal is a reference voltage or a high speed signal and the second input signal is a high speed signal. The amplifying circuit further includes a first transmission gate and a second transmission gate coupled in series between the non-inverting input and an inverting input that are enabled during the offset calibration mode. A benefit of this approach is that capacitance between the inverting and non-inverting inputs is reduced by the first and second transmission gates being in series. There is further benefit in reducing this capacitance by having each transmission gate receive an enable signal from a different source.

17 Claims, 2 Drawing Sheets

US 7,898,323 B2

AMPLIFYING CIRCUIT WITH OFFSET COMPENSATION

BACKGROUND

1. Field

This disclosure relates generally to amplifying circuits, and more specifically, to amplifying circuits with offset compensation.

2. Related Art

Amplifying circuits are commonly used in a variety of circuit applications. Amplifying circuits may include differential amplifiers which compare an input signal to a reference signal. However, differential amplifiers introduce an input offset voltage which can reduce the accuracy of the comparison. This reduction in accuracy may result in a difference in duty cycle between the input signal and the output of the amplifying circuit. This may reduce performance of the circuitry which relies on the output of the amplifying circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
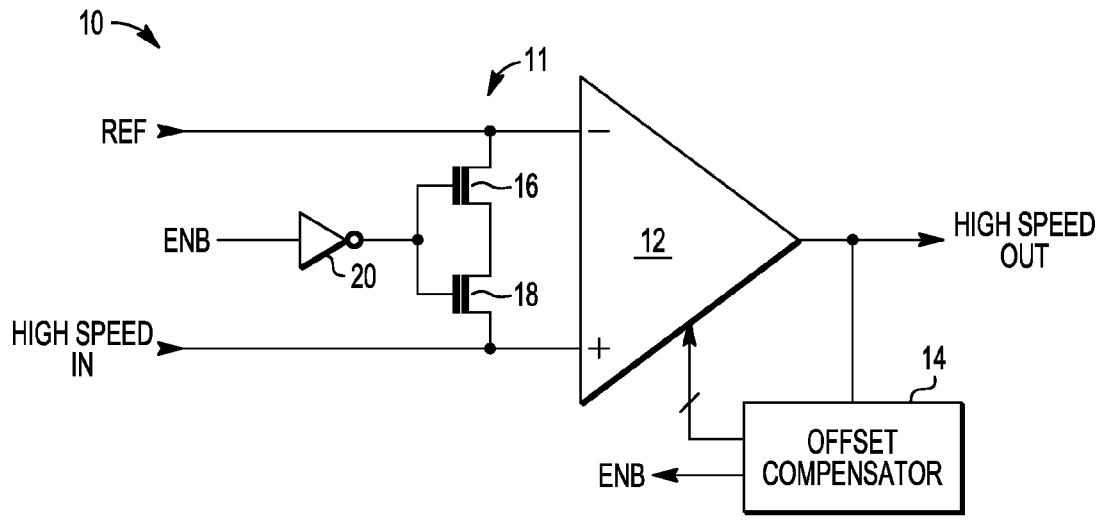
FIG. 1 illustrates, in partial schematic and partial block diagram form, an amplifying circuit in accordance with an embodiment of the present invention.

In one embodiment, an amplifying circuit includes a differential amplifier which receives a high speed input signal and compares this signal to a reference signal to produce an amplified output signal. An offset compensator is used during an offset calibration mode to compensate for the input offset voltage of the differential amplifier. During the offset calibration mode, the positive and negative terminals of the differential amplifier are shorted in order for the offset compensator to appropriately compensate for the input offset voltage such that improved accuracy may be achieved during normal operation. However, the shorting circuitry used for coupling together the two inputs of the differential amplifier also creates unwanted noise during normal operation, when the input terminals of the amplifier are not coupled together and the differential amplifier is instead comparing an input signal to a reference signal. This unwanted noise introduced, for example, by the capacitance present in this shorting circuitry which is coupled to the input terminals of the differential amplifier, results in inaccurate comparisons between the input signal and the reference signal. For example, the input offset voltage may change the perceived level of the reference signal by the differential amplifier. This may cause a mismatch in duty cycles between the input signal and the output signal. It has been observed that this unwanted noise is exacerbated when the amplifying circuit operates at high speed. For example, when the input signal to be amplified by the differential amplifier switches at speeds exceeding 1 Gigahertz (such as in a double data rate (DDR) application in which an 800 Megahertz clock is used), the faster transitions of the input signal injects more noise and increases the impact of the noise introduced by the shorting circuitry. That is, the margins are further reduced as the switching speed of the input signal increases. Therefore, in one embodiment, shorting circuitry is used which includes multiple transistors connected in series between the input terminals of the amplifier and which operates to couple the input terminals to each other during offset calibration mode.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Each signal described herein may be designed as positive or negative logic, where negative logic can be indicated by a bar over the signal name, an asterisk (*) following the name, or a "B" following the name. For example, the enable signal, ENB, is implemented as a negative logic signal. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in partial schematic and partial block diagram form, an amplifying circuit 10 which includes shorting circuitry 11, a differential amplifier 12, and an offset compensator 14. Differential amplifier 12 includes a negative input terminal (also referred to as an inverting input) coupled to receive a first input signal (such as, for example, a reference signal) and a positive input terminal (also referred to as a non-inverting input) coupled to receive a second input signal, which, in one embodiment, may be a high speed input signal (e.g. HIGH SPEED IN) which may transition at a high speed (such as at a speed exceeding approximately 800 Megahertz, or alternatively, exceeding approximately 1 Gigahertz, or alternatively, exceeding approximately 5 Gigahertz). Differential amplifier 12 includes an output terminal which provides an amplified output signal (e.g. HIGH SPEED OUT). Offset compensator 14 is coupled to the output terminal of differential amplifier 12 and provides one or more control signals to differential amplifier 12. In one embodiment, the one or more control signals are provided to an offset control input of differential amplifier 12. Offset compensator also provides an enable signal, ENB, which, when asserted (a logic level 0), indicates that amplifying circuit 10 is in an offset calibration mode and, when negated (a logic level 1), indicates that amplifying circuit 10 is not in the offset calibration mode and instead in a normal mode (and thus in normal operation). Shorting circuitry 11 includes a transmission gate 16 having a first current electrode coupled to the negative input terminal of differential amplifier 12. Shorting circuitry 11 includes a transmission gate 18 having a first current electrode coupled to a second current electrode of transmission gate 16. A second current electrode of transmission gate 18 is coupled to the positive input terminal of differential amplifier 12. A control electrode of each of transmission gates 16 and 18 is coupled to an output of an inverter 20. Inverter 20 receives the enable signal, ENB, at its input terminal.

In operation, when in offset calibration mode, shorting circuitry 11 couples the negative input terminal to the positive input terminal, thus equalizing the input terminals of differential amplifier 12. That is, when in offset calibration mode, ENB is a logic level 0, thus a logic level 1 is provided to the control electrodes of transmission gates 16 and 18, enabling both transmission gates to conduct and thus connecting the positive and negative input terminals of differential amplifier 12. At this time, offset compensator 14, using the output signal of differential amplifier 12, can provide an appropriate setting (via, for example, one or more control signals) to differential amplifier 12 to compensate for the input offset voltage of the differential amplifier 12. The appropriate setting is then used during normal operation of differential amplifier 12 to appropriately provide compensation for the input offset voltage. Therefore, in one embodiment, during offset calibration mode, the positive and negative inputs of differential amplifier 12 are equalized using a plurality of transmission gates in series (such as, for example, transmission gates 16 and 18 within shorting circuitry 11), and offset compensator 14 then determines a needed amount of compensation and sets differential amplifier 12 for the needed amount of compensation.

Note that any offset compensator 14 known in the art may be used. In one embodiment, transmission gates 16 and 18 are each implemented with a single N-type transistor. In an alternate embodiment, each of transmission gates 16 and 18 can be implemented as a full transmission gate having both an N-type transistor and a P-type transistor. Note that, as used herein, the current electrodes of a transistor may also be referred to as the current terminals, and the control electrode as the gate. Also, as used herein, a transmission gate includes two current electrodes or terminals (also referred to as signal terminals) and one or more control inputs (wherein the number of control inputs depends on whether a full transmission gate is used or not). Also, note that N-type and P-type transistors may also be referred to as N channel and P channel transistors, respectively.

When in normal mode, ENB is a logic level 1, thus the output of inverter 20 provides a logic level 0 to the control electrodes of transmission gates 16 and 18, thus turning them off. In one embodiment, during normal mode, differential amplifier 12 operates normally in which the high speed input signal is compared to the reference signal and the output signal is generated accordingly. For example, in the illustrated embodiment, if the voltage of the high speed input signal is greater than the voltage of the reference signal, then the output signal is at a logic level 1 and if the voltage of the high speed input signal is less than the voltage of the reference signal, then the output signal is at a logic level 0. In one embodiment, differential amplifier 12 amplifies the switching voltage rails of the input signal. With the settings that were provided by offset compensator 14 during offsets calibration mode, the output signal of differential amplifier 12 provides a same duty cycle as the input signal. That is, the duty cycles of HIGH SPEED IN and HIGH SPEED OUT match.

In an alternate embodiment, when in normal mode, differential amplifier 12 may operate as a fully-differential high-speed amplifier in which both the first and second input signals are high speed signals. However, in this alternate embodiment, during calibration mode, one of the two input signals (such as, for example, the first input signal) is provided as a reference voltage rather than a high speed signal. Therefore, in calibration mode, amplifier 12 would operate as described above.

Note that during normal mode, transmission gates 16 and 18, although turned off, present parasitic capacitance to the input terminals of differential amplifier 12. However, since transmission gates 16 and 18 are connected in series between the input terminals, the capacitance of shorting circuitry 11 may be reduced as compared to the capacitance which would be present if shorting circuitry 11 were implemented with a single transmission gate connected between the input terminals.

Figure 2:
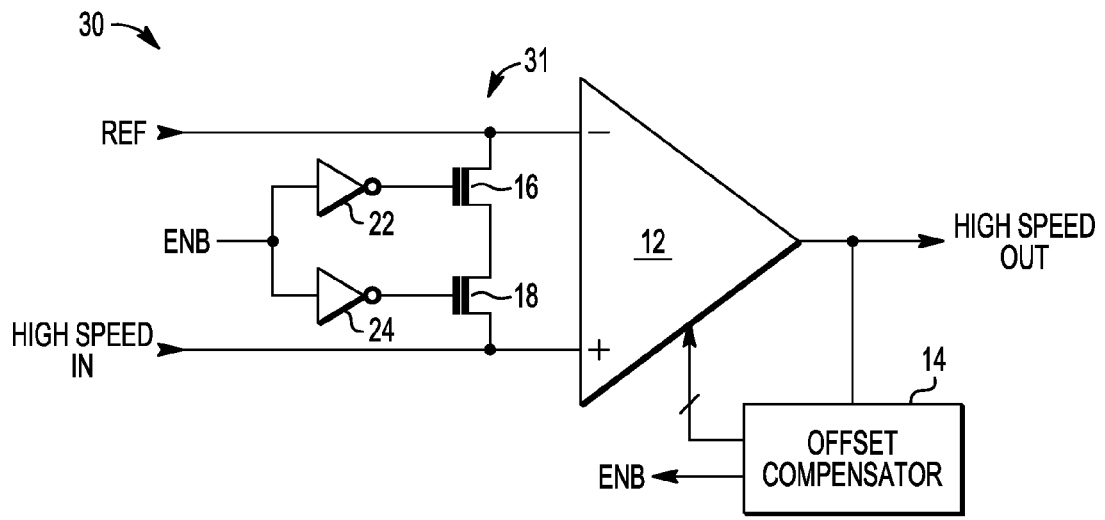
FIG. 2 illustrates, in partial schematic and partial block diagram form, an amplifying circuit in accordance with an embodiment of the present invention.

FIG. 2 illustrates, in partial schematic and partial block diagram form, an amplifying circuit 30 which includes shorting circuitry 31, differential amplifier 12, and offset compensator 14. Note that like reference numbers are used to indicate like elements. Therefore, differential amplifier 12 and offset compensator 14 can be the same and operate in the same manner as those described in reference to FIG. 1. Therefore, amplifying circuit 30 is similar to amplifying circuit 10, except with respect to shorting circuitry 31. Shorting circuitry 31 is also similar to shorting circuitry 11 in which transmission gates 16 and 18 couple the input terminals of differential amplifier 12 during offset calibration mode. However, the control electrodes of transmission gates 16 and 18 are controlled by separate inverters 22 and 24 rather than a single inverter, such as inverter 20 in FIG. 1. That is, in FIG. 2, each of transmission gates 16 and 18 receives the enable signal from a different source. Therefore, referring to FIG. 2, the enable signal, ENB, is provided to the input terminals of each of inverters 22 and 24. The output of inverter 22 is coupled to the control electrode of transmission gate 16, and the output of inverter 24 is coupled to the control electrode of transmission gate 18. Note that, during offset calibration mode, when ENB is at a logic level 0, the control electrodes of transmission gates 16 and 18 are each at a logic level 1, thus turning on transmission gates 16 and 18. During normal operation, when ENB is at a logic level 1, transmission gates 16 and 18 are both off.

Although the control electrodes of each of transmission gates 16 and 18 are controlled by ENB, as was the case in FIG. 1, in the embodiment of FIG. 2, the control electrodes of each of transmission gates 16 and 18 are controlled by separate logic gates (inverters 22 and 24). This may allow for the effective capacitance between the input terminals to be further reduced as compared to the use of a single logic gate driving both control electrodes. Furthermore, the use of a separate logic gate for each control electrode of the transmission gates between the input terminals may reduce the effect of noise coupled onto each control electrode by sinking the charge present on the control electrodes.

As described above in reference to FIG. 1, transmission gates 16 and 18 are each implemented with a single N-type transistor. In an alternate embodiment, each of transmission gates 16 and 18 can be implemented as a full transmission gate having both an N-type transistor and a P-type transistor. Also, with respect to FIGS. 1 and 2, note that any number of transmission gates connected in series may be used between the input terminals of differential amplifier 12. In FIG. 1, the control electrode of each transmission gate would receive the output of inverter 20, and in FIG. 2, the control electrode of each transmission gate would receive the output of a separate logic gate between the ENB input signal and the control electrode (where, for example, additional inverters, similar to inverters 22 and 24, would also be present, one or more for each transmission gate).

Figure 3:
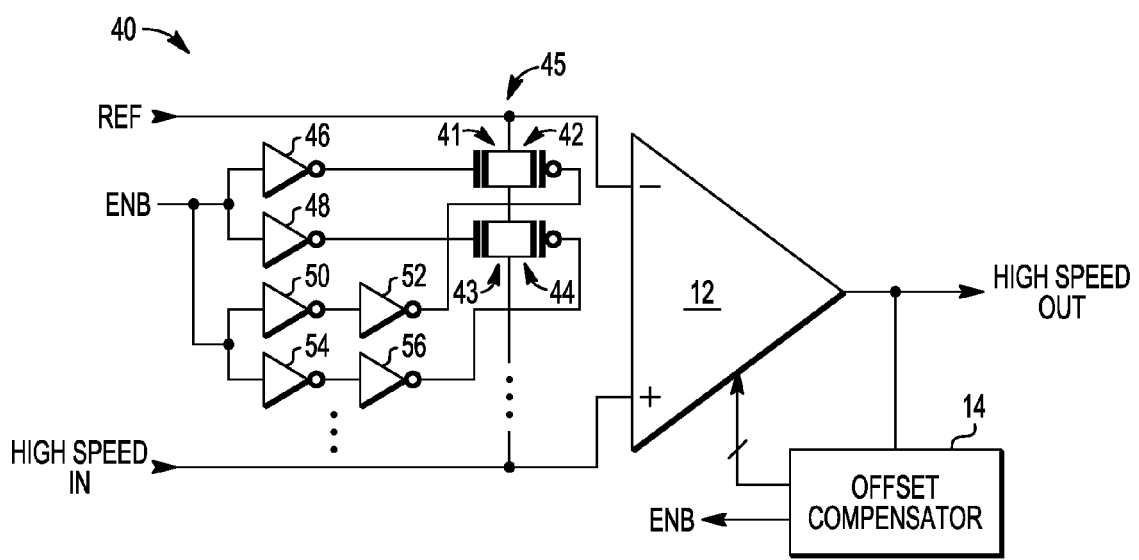
FIG. 3 illustrates, in partial schematic and partial block diagram form, an amplifying circuit in accordance with an embodiment of the present invention.

FIG. 3 illustrates, in partial schematic and partial block diagram form, an amplifying circuit 40 which includes shorting circuitry 45, differential amplifier 12, and offset compensator 14. Note that like reference numbers are used to indicate like elements. Therefore, differential amplifier 12 and offset compensator 14 can be the same and operate in the same manner as those described in reference to FIG. 1. Therefore, amplifying circuit 40 is similar to amplifying circuit 10. Shorting circuitry 45 operates similar to shorting circuitry 11 in that, during offset calibration mode, shorting circuitry 45 couples the input terminals of differential amplifier 12 to each other.

Shorting circuitry 45 includes two or more full transmission gates connected in series between the input terminals of differential amplifier 12. Each full transmission gate includes both an N-type transistor and a P-type transistor coupled in parallel. For example, shorting circuitry 45 includes an N-type transistor 41 having a first current electrode coupled to the negative input terminal of differential amplifier 12 and a P-type transistor 42 having a first current electrode coupled to the negative input terminal of differential amplifier 12 and the first current electrode of N-type transistor 41. Shorting circuitry 45 also includes an N-type transistor 43 having a first current electrode coupled to the second current electrodes of transistors 41 and 42 and a P-type transistor 44 having a first current electrode coupled to the second current electrode of transistors 41 and 42 and the first current electrode of N-type transistor 43. Transistors 41 and 42 form a first full transmission gate and transistors 43 and 44 form a second full transmission gate, where the first and second full transmission gates are connected in series between the input terminals of differential amplifier 12. Note that shorting circuitry can include any number of additional full transmission gates in series with the first and second full transmission gates, as indicated by the 3 dots. If there are only two transmission gates in series, then the second current electrodes of transistors 43 and 44 are coupled to the positive input terminal of differential amplifier 12.

Amplifying circuit 40 also includes inverters 46, 48, 50, 52, 54, and 56 which provide the appropriate control signals, based on ENB, to the control electrodes of transistors 41, 42, 43, and 44. An input of inverter 46 receives ENB and an output of inverter 46 is coupled to the control electrode of transistor 41. An input of inverter 48 receives ENB and an output of inverter 48 is coupled to the control electrode of transistor 43. An input of inverter 50 receives ENB and an output of inverter 50 is coupled to an input of inverter 52. An output of inverter 52 is coupled to the control electrode of transistor 42. An input of inverter 54 receives ENB and an output of inverter 54 is coupled to an input of inverter 56. An output of inverter 56 is coupled to the control electrode of transistor 44. Therefore, note that each full transmission gate is controlled by ENB and receives ENB via one or more logic gates. Also, the one or more logic gates is separate for each control electrode of each transistor. For example, the outputs of inverters 46, 48, 52, and 56 are each provided to only one control electrode and are not shared by multiple control electrodes. In an alternate embodiment, one or more control electrodes may share a logic gate, similar to the embodiment shown in FIG. 1. Also, note that the one or more logic gates which provides the ENB signal to the control electrodes of the full transmission gates may include any type of logic gates such as buffers or inverters, or any combination thereof.

Therefore, referring to operation of FIG. 3, the enable signal, ENB, is provided to the input terminals of each of inverters 46, 48, 50, and 54. Note that, during offset calibration mode, when ENB is at a logic level 0, the control electrodes of transistors 41 and 43 are each at a logic level 1 and the control electrodes of transistors 42 and 44 are each at a logic level 0, thus turning on the first and second full transmission gates. During normal operation, when ENB is at a logic level 1, each of the full transmission gates is off.

As with FIG. 1, since the full transmission gates are connected in series between the input terminals of differential amplifier 12, capacitance of shorting circuitry 45 may be reduced as compared to the capacitance which would be present if shorting circuitry 45 were implemented with a single full transmission gate connected between the input terminals. Also, as with FIG. 2, each of transistors 41-44 are separately controlled by one or more logic gates which may allow for the effective capacitance between the input terminals to be further reduced as compared to the use of a shared logic gate driving more than one control electrode of shorting circuitry 45. Note that, in alternate embodiments, any type of buffer may be used for enabling the transmission gates (such as the transmission gates of FIG. 1, 2, or 3). For example, in the embodiment of FIG. 2, a buffer including an inverter (such as inverter 22 or 24) is used to enable a transmission gate, and, in the embodiment of FIG. 3, buffers including inverters (such as inverters 46 or 48 or inverters 50 and 52 or inverters 54 and 56) are used to enable a control input of a transmission gate. In alternate embodiments, any type of circuitry may be used to implement these buffers, such as, for example, any combination of one or more logic gates.

Also, in an alternate embodiment, during calibration mode, normal mode, or both modes, the reference signal may be provided to the positive input terminal of amplifier 12 and HIGH SPEED IN may be provided to the negative input terminal of amplifier 12. Also, in an alternate embodiment, amplifier 12, during normal mode, may operate as a fully-differential amplifier in which each of the positive and negative input terminals of amplifier 12 receive a high speed input signal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. Those skilled in the art will also recognize that the boundaries between logic blocks are merely illustrative and that alternative embodiments may merge logic blocks or circuit elements or impose an alternate decomposition of functionality upon various logic blocks or circuit elements. In one embodiment, the illustrated elements of each of circuits 10, 30, and 40 are circuitry located on a single integrated circuit or within a same device. Alternatively, any number of separate integrated circuits or separate devices interconnected with each other may be used.

Although the invention is described herein with reference to specific embodiments, various modifications and changes can be made without departing from the scope of the present invention as set forth in the claims below. For example, any number of transmission gates may be used in series to connect the input terminals of amplifier 12, and, for example, each transmission gate may be a full transmission gate. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes an amplifying circuit having an offset calibration mode and a normal mode. The amplifying circuit includes an amplifier having a non-inverting input and an inverting input for receiving, during the normal mode, a first input signal and a second input signal and an output for providing a high speed output signal, wherein the first input signal is a reference voltage or a high speed signal and the second input signal is a high speed signal; and a first transmission gate and a second transmission gate coupled in series between the non-inverting input and an inverting input that are enabled during the offset calibration mode. Item 2 includes the amplifying circuit of item 1 and further includes an offset compensator coupled to the amplifier and the first and second transmission gates. Item 3 includes the amplifying circuit of item 2 and further includes a first buffer for enabling the first transmission gate during the offset calibration mode and a second buffer for enabling the second transmission gate during the offset calibration mode. Item 4 includes the amplifying circuit of item 1 wherein the first transmission gate comprises a first N channel transistor and the second transmission gate comprises a second N channel transistor. Item 5 includes the amplifying circuit of item 4 wherein the first transmission gate further comprises a first P channel transistor and the second transmission gate comprises a second P channel transistor. Item 6 includes the amplifying circuit of item 1 and further includes a third transmission gate in series between the first transmission gate and a second transmission gate that is enabled during the offset calibration mode. Item 7 includes the amplifying circuit of item 1 wherein the first input signal is a reference voltage and is received by the inverting input and the high speed signal is received by the non-inverting input. Item 8 includes the amplifying circuit of item 1 and further includes an offset compensator coupled to the amplifier and for providing an enable signal indicating the offset calibration mode; a first buffer having an input for receiving the enable signal and an output coupled to the first transmission gate; and a second buffer having an input for receiving the enable signal and an output coupled to the second transmission gate. Item 9 includes the amplifying circuit of item 8 the first transmission gate includes a first N channel transistor having a gate coupled to the output of the first buffer, a first current terminal coupled to the non-inverting input, and a second current electrode; and the second transmission gate includes a second N channel transistor having a gate coupled to the output of the second buffer, a first current terminal coupled to the second current electrode of the first N channel transistor, and a second current electrode coupled to the inverting input. Item 10 includes the amplifying circuit of item 9 and further includes a third buffer having an input for receiving the enable signal and an output; a fourth buffer having an input for receiving the enable signal and an output; wherein the first transmission gate further includes a first P channel transistor having a gate coupled to the output of the third buffer, a first current terminal coupled to the non-inverting input, and a second current electrode; and wherein the second transmission gate further includes a second P channel transistor having a gate coupled to the output of the fourth buffer, a first current electrode coupled to the second current electrode of the first P channel transistor, and a second current electrode coupled to the non-inverting input.

Item 11 includes an amplifying circuit including an amplifier having a non-inverting input and an inverting input; a first transmission gate having a first signal terminal coupled to the non-inverting input, a control input, and a second signal terminal; a second transmission gate having a first signal terminal coupled to the second signal terminal of the first transmission gate, a second signal terminal coupled to the inverting input, and a control input; a first buffer having an input for receiving an enable signal and an output coupled to the control input of the first transmission gate; and a second buffer having an input for receiving the enable signal and an output coupled to the control input of the first transmission gate. Item 12 includes the amplifying circuit of item 11 wherein the first buffer includes a first inverter; and the second buffer includes a second inverter. Item 13 includes the amplifying circuit of item 12 wherein the first transmission gate includes a first N channel transistor having a gate coupled to the output of the first buffer, a first current terminal coupled to the non-inverting input, and a second current electrode; and the second transmission gate includes a second N channel transistor having a gate coupled to the output of the second buffer, a first current terminal coupled to the second current electrode of the first N channel transistor, and a second current electrode coupled to the inverting input. Item 14 includes the amplifying circuit of item 13 wherein the amplifier is further characterized as having an offset control input, further including an offset compensator having a first input coupled to the output of the amplifier, a first output coupled to the offset control input, and a second output for providing the enable signal. Item 15 includes the amplifying circuit of item 14 and further includes a third buffer having an input for receiving the enable signal and an output; and a fourth buffer having an input for receiving the enable signal and an output; wherein the first transmission gate further includes a first P channel transistor having a gate coupled to the output of the third buffer, a first current terminal coupled to the non-inverting input, and a second current electrode; and wherein the second transmission gate further includes a second P channel transistor having a gate coupled to the output of the fourth buffer, a first current electrode coupled to the second current electrode of the first P channel transistor, and a second current electrode coupled to the non-inverting input. Item 16 includes the amplifying circuit of item 14 and further includes a third transmission gate in series between the first transmission gate and a second transmission gate that is enabled during the offset calibration mode. Item 17 includes the amplifying circuit of item 16 wherein the third transmission gate includes an N channel transistor. Item 18 includes the amplifying circuit of item 17 wherein the third transmission gate further includes a P channel transistor.

Item 19 includes a method of providing offset compensation for an amplifier having a non-inverting input and an inverting input. The method includes equalizing the inverting and non-inverting inputs using a plurality of transmission gates in series during an offset calibration mode of the amplifier; determining a needed amount of offset compensation; setting the amplifier for the needed amount of offset compensation; and operating the amplifier with a high speed input so that capacitance between the inverting input and the non-inverting input is a series capacitance of the plurality of transmission gates. Item 20 includes the method of item 19 wherein the step of equalizing is performed using N channel transistors for the plurality of transmission gates, wherein each N channel transistor receives an enable signal from a different source.

What is claimed is:

1. An amplifying circuit having an offset calibration mode and a normal mode, comprising:
    an amplifier having a non-inverting input and an inverting input for receiving, during the normal mode, a first input signal and a second input signal and an output for providing a high speed output signal, wherein the first input signal is a reference voltage or a high speed signal and the second input signal is a high speed signal;
    a first transmission gate and a second transmission gate coupled in series between the non-inverting input and an inverting input that are enabled during the offset calibration mode; and
    a first buffer for enabling the first transmission gate during the offset calibration mode and a second buffer for enabling the second transmission gate during the offset calibration mode.

2. The amplifying circuit of claim 1, further comprising an offset compensator coupled to the amplifier and the first and second transmission gates.

3. The amplifying circuit of claim 1, wherein the first transmission gate comprises a first N channel transistor and the second transmission gate comprises a second N channel transistor.

4. The amplifying circuit of claim 3, wherein the first transmission gate further comprises a first P channel transistor and the second transmission gate comprises a second P channel transistor.

5. An amplifying circuit having an offset calibration mode and a normal mode, comprising:
    an amplifier having a non-inverting input and an inverting input for receiving, during the normal mode, a first input signal and a second input signal and an output for providing a high speed output signal, wherein the first input signal is a reference voltage or a high speed signal and the second input signal is a high speed signal;
    a first transmission gate and a second transmission gate coupled in series between the non-inverting input and an inverting input that are enabled during the offset calibration mode; and
    a third transmission gate in series between the first transmission gate and a second transmission gate that is enabled during the offset calibration mode.

6. The amplifying circuit of claim 1, wherein the first input signal is a reference voltage and is received by the inverting input and the second input signal is received by the non-inverting input.

7. An amplifying circuit having an offset calibration mode and a normal mode, comprising:
    an amplifier having a non-inverting input and an inverting input for receiving, during the normal mode, a first input signal and a second input signal and an output for providing a high speed output signal, wherein the first input signal is a reference voltage or a high speed signal and the second input signal is a high speed signal;
    a first transmission gate and a second transmission gate coupled in series between the non-inverting input and an inverting input that are enabled during the offset calibration mode;
    an offset compensator coupled to the amplifier and for providing an enable signal indicating the offset calibration mode;
    a first buffer having an input for receiving the enable signal and an output coupled to the first transmission gate; and
    a second buffer having an input for receiving the enable signal and an output coupled to the second transmission gate.

8. The amplifying circuit of claim 7, wherein:
    the first transmission gate comprises a first N channel transistor having a gate coupled to the output of the first buffer, a first current terminal coupled to the non-inverting input, and a second current electrode; and
    the second transmission gate comprises a second N channel transistor having a gate coupled to the output of the second buffer, a first current terminal coupled to the second current electrode of the first N channel transistor, and a second current electrode coupled to the inverting input.

9. The amplifying circuit of claim 8, further comprising:
    a third buffer having an input for receiving the enable signal and an output; and
    a fourth buffer having an input for receiving the enable signal and an output;
    wherein the first transmission gate further comprises a first P channel transistor having a gate coupled to the output of the third buffer, a first current terminal coupled to the non-inverting input, and a second current electrode; and
    wherein the second transmission gate further comprises a second P channel transistor having a gate coupled to the output of the fourth buffer, a first current electrode coupled to the second current electrode of the first P channel transistor, and a second current electrode coupled to the non-inverting input.

10. An amplifying circuit, comprising:
    an amplifier having a non-inverting input and an inverting input;
    a first transmission gate having a first signal terminal coupled to the non-inverting input, a control input, and a second signal terminal;
    a second transmission gate having a first signal terminal coupled to the second signal terminal of the first transmission gate, a second signal terminal coupled to the inverting input, and a control input;
    a first buffer having an input for receiving an enable signal and an output coupled to the control input of the first transmission gate; and
    a second buffer having an input for receiving the enable signal and an output coupled to the control input of the first transmission gate.

11. The amplifying circuit of claim 10, wherein:
    the first buffer comprises a first inverter; and
    the second buffer comprises a second inverter.

12. The amplifying circuit of claim 11, wherein:
    the first transmission gate comprises a first N channel transistor having a gate coupled to the output of the first buffer, a first current terminal coupled to the non-inverting input, and a second current electrode; and
    the second transmission gate comprises a second N channel transistor having a gate coupled to the output of the second buffer, a first current terminal coupled to the second current electrode of the first N channel transistor, and a second current electrode coupled to the inverting input.

13. The amplifying circuit of claim 12, wherein the amplifier is further characterized as having an offset control input, further comprising an offset compensator having a first input coupled to the output of the amplifier, a first output coupled to the offset control input, and a second output for providing the enable signal.

14. The amplifying circuit of claim 13, further comprising:
a third buffer having an input for receiving the enable signal and an output; and
a fourth buffer having an input for receiving the enable signal and an output;
wherein the first transmission gate further comprises a first P channel transistor having a gate coupled to the output of the third buffer, a first current terminal coupled to the non-inverting input, and a second current electrode; and
wherein the second transmission gate further comprises a second P channel transistor having a gate coupled to the output of the fourth buffer, a first current electrode coupled to the second current electrode of the first P channel transistor, and a second current electrode coupled to the non-inverting input.

15. The amplifying circuit of claim 13, further comprising:
a third transmission gate in series between the first transmission gate and a second transmission gate that is enabled during the offset calibration mode.

16. The amplifying circuit of claim 15, wherein the third transmission gate comprises an N channel transistor.

17. The amplifying circuit of claim 16, wherein the third transmission gate further comprises a P channel transistor.

* * * * *